(12) United States Patent
Chlipala et al.

(10) Patent No.: US 7,174,532 B2
(45) Date of Patent: Feb. 6, 2007

(54) METHOD OF MAKING A SEMICONDUCTOR DEVICE BY BALANCING SHALLOW TRENCH ISOLATION STRESS AND OPTICAL PROXIMITY EFFECTS

(75) Inventors: James D. Chlipala, Lower Macungie Township, Lehigh County, PA (US); Shahriar Moinian, New Providence, NJ (US)

(73) Assignee: Agere Systems, Inc., Allentown, PA (US)

( * ) Notice: Subject to any disclaimer, the term of this patent is extended or adjusted under 35 U.S.C. 154(b) by 145 days.

(21) Appl. No.: 10/992,031

(22) Filed: Nov. 18, 2004

(65) Prior Publication Data

US 2006/0107243 A1    May 18, 2006

(51) Int. Cl.
*G06F 17/50* (2006.01)

(52) U.S. Cl. .............................. 716/19; 716/20; 716/21
(58) Field of Classification Search .................... 716/2, 716/19, 20, 21
See application file for complete search history.

(56) References Cited

U.S. PATENT DOCUMENTS 6,977,392 B2 * 12/2005 Yamazaki et al. ............. 257/59

* cited by examiner

*Primary Examiner*—Thuan Do (57) ABSTRACT

The present invention provides a method for manufacturing a semiconductor device, comprising: determining an isolation structure stress effect of a first semiconductor device, determining an optical proximity effect of a second semiconductor device, selecting a modeling design parameter such that the isolation structure stress effect is offset against the optical proximity effect on a fabrication model, and using the selected design parameter to construct a third semiconductor device.

19 Claims, 8 Drawing Sheets

METHOD OF MAKING A SEMICONDUCTOR DEVICE BY BALANCING SHALLOW TRENCH ISOLATION STRESS AND OPTICAL PROXIMITY EFFECTS

TECHNICAL FIELD OF THE INVENTION

The present invention is directed, in general, to semiconductor fabrication processes and, more specifically, to a method and system that balances isolation structure stress effects against optical proximity effects to insure that modeling performance is more accurately reflected in actual production devices.

BACKGROUND OF THE INVENTION

The fabrication of a semiconductor device involves hundreds of steps, each of which must be executed as accurately as possible to achieve a high-yield, functioning device. The beginning steps of fabrication begin with an electrical schematic of the integrated circuit, which is converted to a design layout that is used to ultimately construct a lithographic mask. As device sizes have moved well into the submicron range and component density has significantly increased, the accuracy of the lithographic processes has diminished inasmuch as many of the feature sizes have become smaller than the wavelength that is used to expose the photoresist located on the silicon wafer. This, in turn, allows diffraction that can cause feature distortion. The critical dimension inaccuracies of these lithographic processes are addressed by adding dummy features in the mask configuration and through other simulation programs. However, while this often satisfactorily addresses critical dimension concerns, it fails to address device operational or electrical characteristics that vary from those predicted by the design layout modeling processes and that are influenced by spacing between multi-strip gate structures, both active and dummy structures.

One factor that affects the operational or electrical characteristics is attributable to the presence of shallow trench isolation structures adjacent to transistor gates. It is known that these shallow trench isolation structures cause a compressive stress effect in the silicon in which the MOSFET channel region is located. This phenomenon is known as shallow trench isolation stress effect or "STI" stress effect.

In the past, STI stress effect was less of an issue because of the large size of the gate oxide areas and general device size in that by the time the stress reached the middle of the channel, it had been substantially dissipated. However, as the size of these gate oxide areas has shrunk below the 0.25 micron range, the STI stress effect has grown in significance due to the relatively small device size. The reason for this is that when the edges of the STI come closer together, there is not enough distance between the edges for stress relief itself. The STI stress effect has been exacerbated by the even smaller devices found in present day submicron technologies. As a result, it affects the active channels of the MOSFETS. For example, STI stress effect has been found to cause drive current degradations in MOSFETS and has also been found to cause defect and device leakage.

Increased device density and decreased feature size have made sub-wavelength patterning routine in integrated circuit fabrication, and have required the development of the technique known as optical process, or proximity, correction (OPC). OPC is a process that is conducted to account for exposure variations that occur due to proximity effects during the lithographic process. OPC is basically a mask making process peculiar to each lithographic fabrication facility and varies from one lithographic fabrication facility to another. During the mask making process, the original images get printed onto masks differently based on each facility's mask formulation process. OPC may include changing the width of mask features, changing the spacing between these features, or adding geometry to features to result in on-substrate features which are closer to the design geometry.

As mentioned above, for very deep, sub-micron processes, it, is difficult to print onto silicon the exact desired device shape due to the exposure limitations inherent in the lithographic processes. Patterning is affected because features have become so small that the light photography does not replicate the features well, particularly at device sizes of 130 nm, 90 nm, 65 nm and below. For example, if a structure is initially designed to be a rectangle having sharp, 90 degree corners, there are some processes, based on the processing that is done at the lithographic fabrication laboratory, that results in rounded corners. These variations occur because the features have become so small that with optical processing, the wavelength is not small enough to print everything accurately due to reflections and diffractions from the mask. As a result, the desired image does not get printed accurately. To compensate for this, the targeted features on the mask are modified, using sophisticated software programs, such that they more accurately print the intended configuration. These modifications affect MOSFET performance in a non-trivial manner.

Accordingly, what is needed in the art is a method that compensates for the deficiencies presently found in current device fabrication processes, as discussed above.

SUMMARY OF THE INVENTION

To address the above-discussed deficiencies of the prior art, the present invention provides a method for manufacturing a semiconductor device, comprising: determining an isolation structure stress effect of a first semiconductor device, determining an optical proximity effect of a second semiconductor device, selecting a modeling design parameter such that the isolation structure stress effect is offset against the optical proximity effect on a fabrication model, and using the selected design parameter to construct a third semiconductor device.

In another embodiment, the present invention provides a system for producing a semiconductor device model for use in fabricating an integrated circuit. This particular embodiment includes an isolation structure stress effect subsystem for providing isolation structure stress effect data of a first semiconductor device, an optical proximity effect subsystem for providing optical proximity effect data of a second semiconductor device, a design layout subsystem that uses the isolation structure stress effect data and the optical proximity effect data to derive a model design layout such that the isolation structure stress effect is offset against the optical proximity effect, and a production design subsystem that uses the model design layout to model a production semiconductor device that includes an integrated circuit layout.

In another embodiment, the present invention provides a semiconductor device that comprises device features defined by a mask wherein the features are formed thru values selected by balancing shallow trench isolation stress effect with optical processing correction effect.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

The invention is best understood from the following detailed description when read with the accompanying FIGURES. It is emphasized that in accordance with the standard practice in the semiconductor industry, various features may not be drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

The present invention uniquely recognizes the benefits associated with using the shallow trench isolation stress effect (hereinafter referred to as the STI stress effect) and the optical proximity effect and their relationship to various electrical properties of a transistor to provide a more accurate correlation between a design model of an integrated circuit and a production device of that integrated circuit. Presently, it has been recognized that the STI effect and the optical proximity effect can each be correlated to an electrical characteristic of a transistor, such as on current ($I_{on}$), off current ($I_{off}$), or threshold voltage ($V_T$). It has further been presently recognized that the STI effect and optical proximity effect influence the electrical properties of the transistor devices. The present invention recognizes that these two effects, along with their relationship to those electrical properties, can be used in the transistor design layout such that the STI and the optical proximity effects can be compensated for, balanced against each other, or possibly canceled altogether, thereby providing a more accurate correlation between design models and the actual production device.

Prior to the present invention, a designer would often layout, in a model design, a multi-stripe transistor pattern having a prescribed spacing between the gate structures and with each gate having a prescribed width and length. Moreover, to correct for the optical proximity effect, dummy structures would often be included in the model layout. Little were designers aware, however, that due to the STI effect, the modeled strength of each transistor would not be accurately reflected when the layout was transferred to silicon. The reason for this is that the distances of the gate structures from the edge of the isolation structure or gate dielectric (referred to herein as the SA distance) selected by the designer were influencing the transistor strength. Thus, the models were not accurately reflecting the devices when they were laid out in silicon. As discussed below, the present invention recognizes the influence that the STI effect and the optical proximity effect have on a transistor's electrical properties, and given this recognition, these two properties can be used to balance each other by compensating for their effects in a design model, and provide a more accurate correlation between design models and the actual production device.

The process of the present invention begins as many other conventional design processes in that an electrical schematic of the integrated circuit is provided by design engineers. This electrical schematic is turned over to physical designers that create mask information from which a simulation model of the integrated circuit can be derived. Masks of the various layers that reflect each layer of the layout are ultimately constructed. A mask layout fabrication facility might go through several iterations of mask design to achieve a higher accuracy mask by accounting for optical proximity effects. OPC algorithms might be employed to generate adjustments that correct for optical proximity effects at each iteration. These masks can then be used to construct a test device.

Figure 1A:
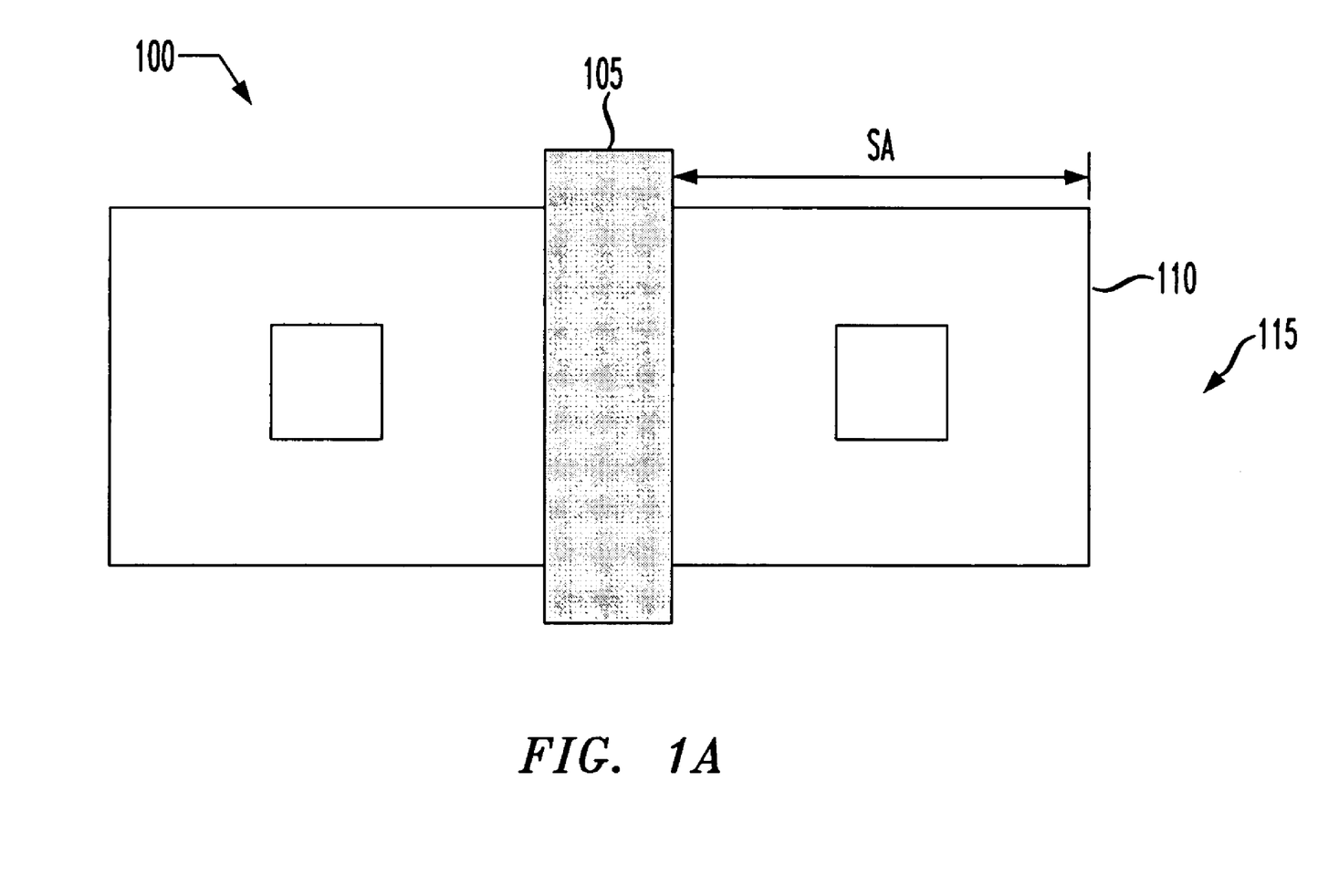
FIG. 1A is an overhead view of an embodiment of a test device from which electrical property measurements can be obtained as it relates to SA distance.

FIG. 1A is an overhead view of one type of a SA test device 100 that can be used to determine STI effect on an electrical property of a layout model. The SA test device 100, in this particular embodiment, includes a conventional gate structure 105 located over a thin oxide region 110, outside of which is an isolation region 115, such as a shallow trench isolation structure (STI). It should be noted that the SA test device 100 may be either an NMOS or a PMOS device, and preferably, measurements are taken from both NMOS and PMOS test devices. Also, while one configuration has been shown, this is exemplary in nature only, and the layout design of the SA test device 100 can vary. The SA test device 100 is preferably one of a multiple of such devices located across a semiconductor wafer (not shown). The SA test device 100 is an active device from which electrical measurements may be taken.

Once the SA test device 100 is constructed, a SA distance is determined for a large enough number of the gate structures 105 located on the wafer to obtain a representative data pool. As mentioned above, the SA distance is associated with the STI effect. The SA distance is about the distance from the edge of the isolation region 115 to the most adjacent edge of the gate structure 105. For example, in FIG. 1A, the SA distance for the gate structure 105 is indicated by the arrow and is the distance from the left edge of the isolation region 115 to the right edge of the gate 105 and is designated, SA.

Measurements of different electrical properties are then taken with respect to the gate structures 105 that are located on the wafer or a sufficient number of such structures such that a good data sample is obtained. The electrical property that is measured may vary. By way of example only, the measured electrical property may be $I_{on}$, $I_{off}$, or $V_T$. Each gate structure 105 may have a different SA value and a different electrical property measurement value, or they may be very similar. These measurements are then inputted into a conventional modeling program that uses the collected data to extrapolate data curves for different types of devices. For example, the program can extrapolate a curve for a high speed device, an average speed device, or a slow speed device. This data can then be presented in a graph, as those discussed below, that relates the actual measured electrical property values to the actual SA distance values and the extrapolated SA data curves for the various types of devices to the measured electrical property.

Figure 1B:
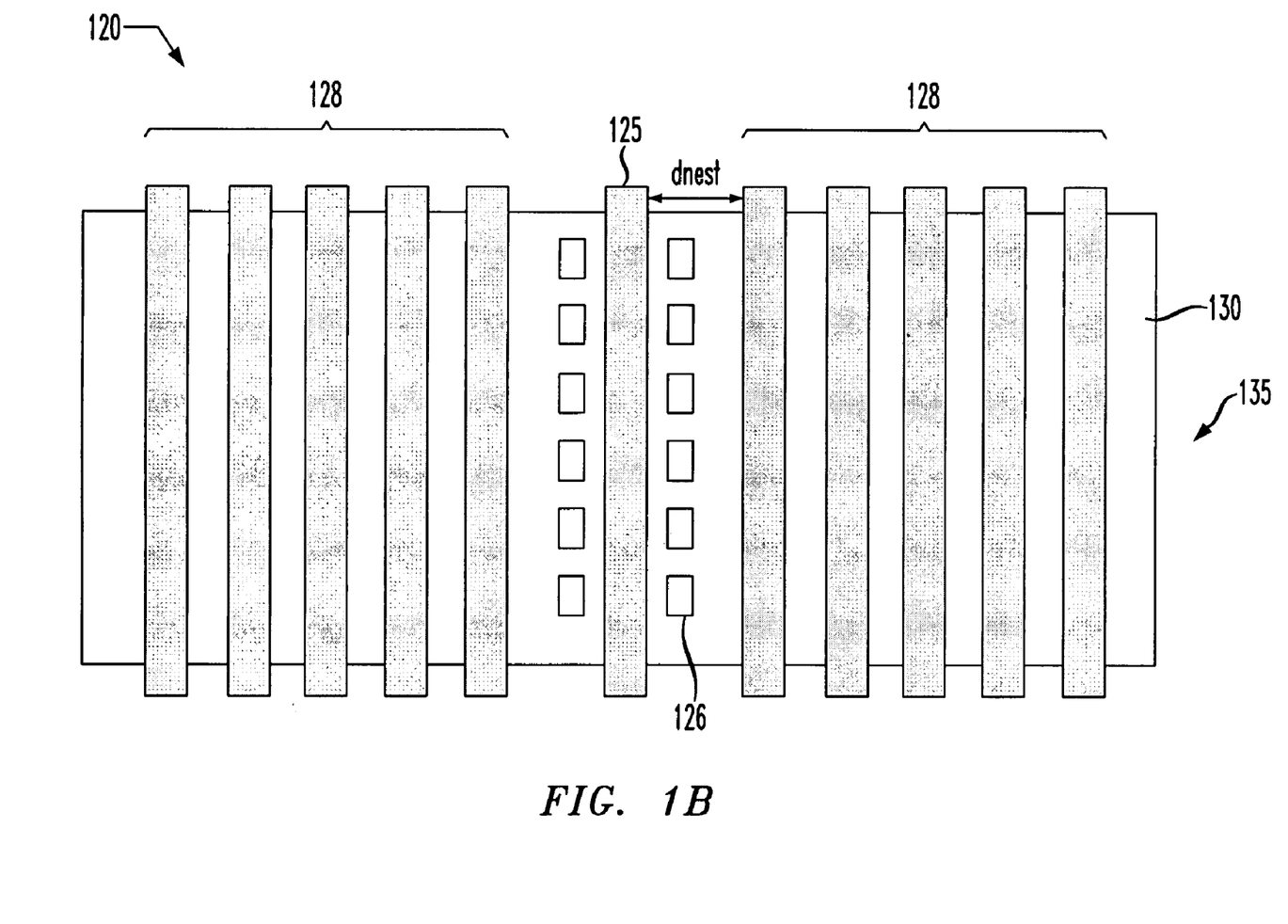
FIG. 1B is an overhead view of an embodiment of a test device from which electrical property measurements can be obtained as it relates to nesting distance.

Turning now to FIG. 1B, there is shown an overhead view of a nesting test device 120. A similar procedure as the one regarding the SA test device 100 can be conducted regarding the nesting test device 120. The nesting test device 120, in the illustrated embodiment, includes an active gate 125 having contacts 126 located on either side thereof and dummy gates 128 that are located over a thin oxide region 130, outside of which is an isolation region 135, such as a STI structure. The active gate 125 is located a dnest distance from the dummy gates 128, as indicated by the arrow. It should be noted that the nesting test device 120 may be either an NMOS or a PMOS device, and preferably, measurements are taken from both NMOS and PMOS test devices. Also, while one configuration has been shown, this is exemplary in nature only and the layout design of the nesting test device 120 can vary. The nesting test device 120 is preferably one of a multiple of such devices located across a semiconductor wafer (not shown). The nesting test device 120 is also an active device from which electrical measurements may be taken.

Once the nesting test device 120 is constructed, a dnest distance is determined for each of the active gates 125 located on the wafer or a number sufficient to obtain a representative data pool. As mentioned above, the dnest distance is associated with the optical proximity effect. The dnest distance is about the distance from the edge of the active gate 125 to an adjacent edge of the first dummy gate 128 on either side of the active gate 125. For example, in FIG. 1B, the dnest distance for the active gate 125 is shown as the distance from the right edge of the active gate 125 to the left edge of the first dummy gate 128 to the right of the active gate 125 and is designated, dnest. It should be further noted that the dnest may also be defined from active gate to active gate as well.

Measurements of different electrical properties are then taken with respect to each of the active gates 125. The electrical property that is measured may vary. By way of example only, the measured electrical property may be $I_{on}$, $I_{off}$, or $V_T$. It should also be noted that each active gate 125 may or may not have a different dnest value and a different electrical property measurement value. These measurements are then inputted into a conventional modeling program that uses the collected data to extrapolate data curves for different types of devices. For example, the program can extrapolate a curve for a high speed device, an average speed device, or a slow speed device. This data can then be presented in a graph, similar to those discussed below, that relates the actual measured electrical property values to the actual dnest distance values and the dnest extrapolated data curves to the measured electrical property for the various types of devices.

Figure 2A:
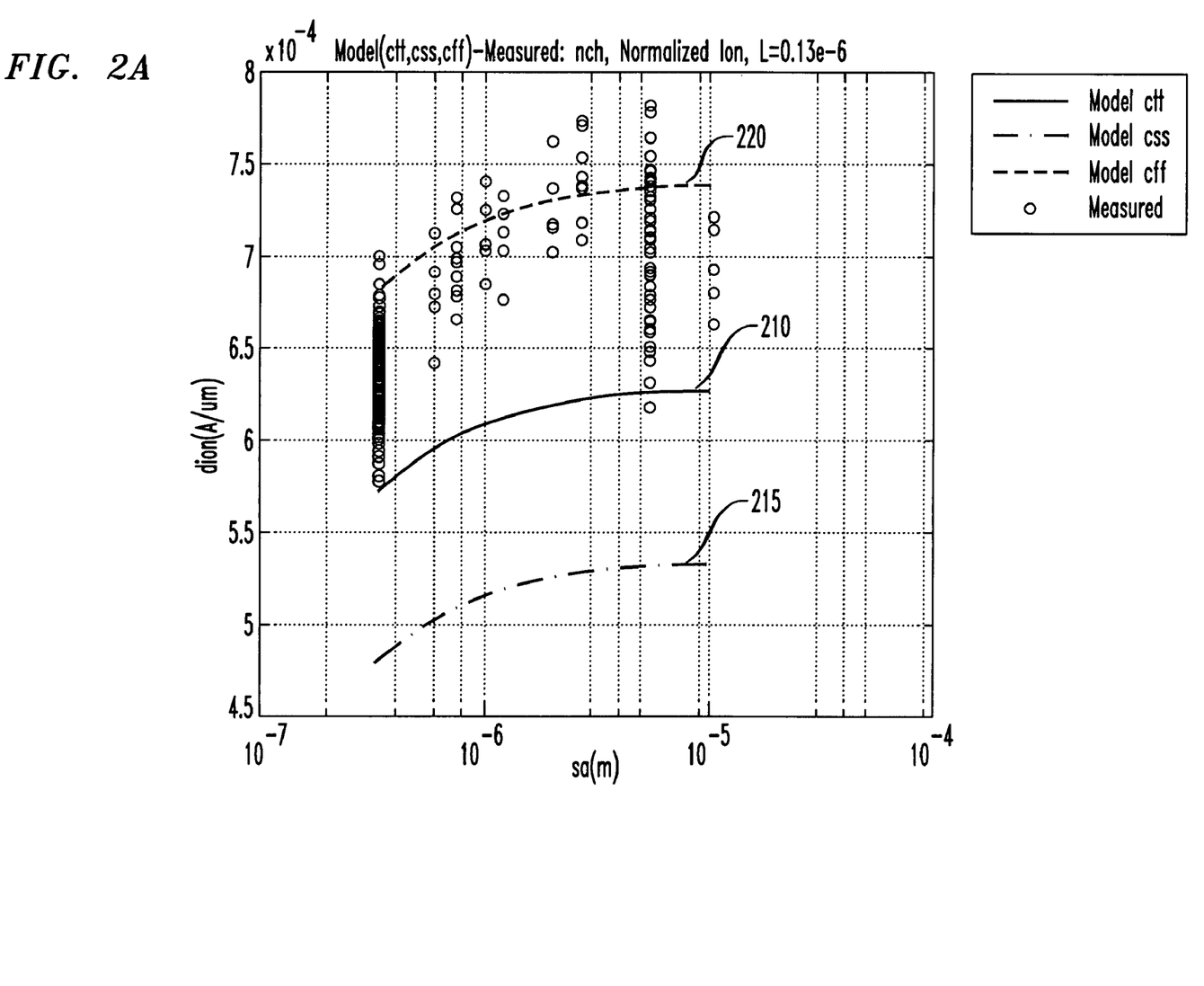
FIG. 2A is a graph representing SA distance data collected from an NMOS test device.

FIG. 2A is a graph representing data collected from an NMOS SA test device, such as the one described above regarding FIG. 1A. The graph represents a plot of SA data, (i.e., STI effect), in microns, versus $I_{on}$ data in amperes/microns, taken from the SA test device. The actual data points are represented by the circles. The curve line 210 is an extrapolated curve of an average speed device, curve line 215 is an extrapolated curve of a slow speed device, and curve line 220 is an extrapolated curve of a high speed device. As seen from this graph, as the SA distance increases, the $I_{on}$ generally improves or becomes stronger.

Figure 2B:
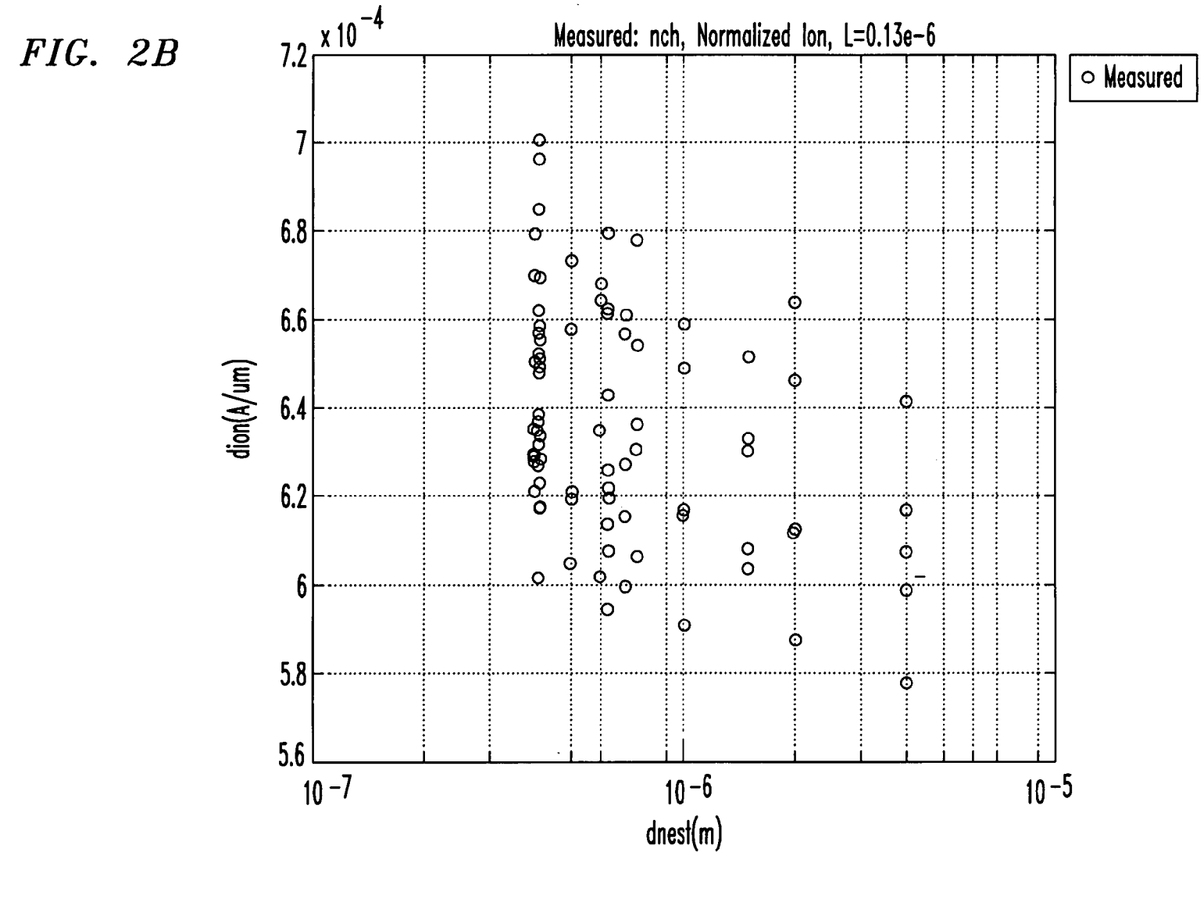
FIG. 2B is a graph representing nesting distance data collected from another NMOS test device.

FIG. 2B is contrasted with FIG. 2A, which is a graph representing data collected from another NMOS test device. It should be noted that while the data was taken from a different NMOS test device than the SA data, the nesting distance data could be taken from the same test device, if so desired. Also, while there are no extrapolated curves as discussed above illustrated on this graph, they could be inserted by use of the appropriate program, or could be mathematically considered in the modeling process. The graph, which is one illustration of the optical proximity effect, represents a plot of $I_{on}$ data in amperes/micron versus nesting distance. From this graph, it is seen that as the nesting distance increases, $I_{on}$ generally degrades or becomes weaker. Thus, in this particular type of device, the STI and the optical proximity effects have opposite effects on the $I_{on}$ of the test NMOS device as functions of their respective distance parameters. Given this complementary relationship, the MOSFET performance change due to one of the effects can be cancelled, either partially or completely, by the MOSFET performance change due to the other effect. This cancellation can be accomplished by a manipulation of the respective distance parameters referenced in FIGS. 2A and 2B. Thus, from the foregoing, it can be seen that, the SA distance, the dnest distance or the electrical property can be selected to achieve the desired offset or balance between the STI effect and the optical proximity effect in a modeling process, and thereby provide another tool with which a designer might more accurately predict the electrical properties of a resulting product.

Figure 3:
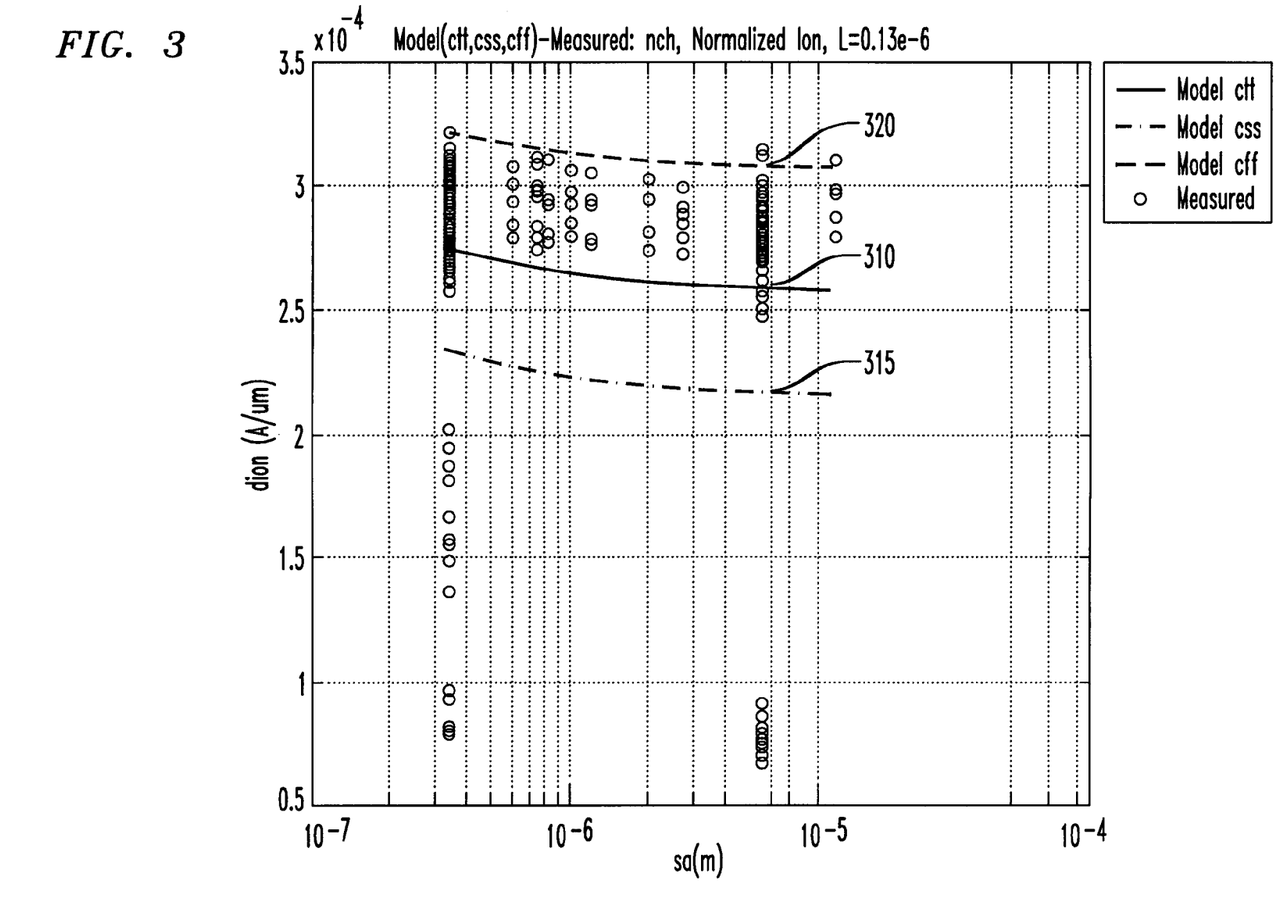
FIG. 3 is a graph representing SA distance data collected from a PMOS test device.

FIG. 3 is a graph representing data collected from a PMOS SA test device similar to the one described above regarding FIG. 1A. The graph represents a plot of $I_{on}$ data in amperes/microns vs. SA data (STI effect), in microns. Also, similar to FIG. 2A, this data was used to extrapolate three different curves. The data points taken from the PMOS SA test device are represented by the circles. Curve line 310 represents extrapolated data of an average speed device, curve line 315 represents extrapolated data of a slow speed device and curve line 320 represents extrapolated date of a high speed device. As seen from this graph, as the SA distance increases, the $I_{on}$ generally degrades or becomes weaker, which is opposite to that of the above-discussed NMOS device. While a graph of the optical proximity effect as it relates to the PMOS device is not shown, it should be understood that the $I_{on}$ would generally decrease or become weaker as the dnest distance decreased. Thus, again, given this complementary relationship, the STI effect, optical proximity effect or an electrical property can be selected to offset or balance the STI effect and the optical proximity effect in a modeling process for a PMOS device.

Figure 4:
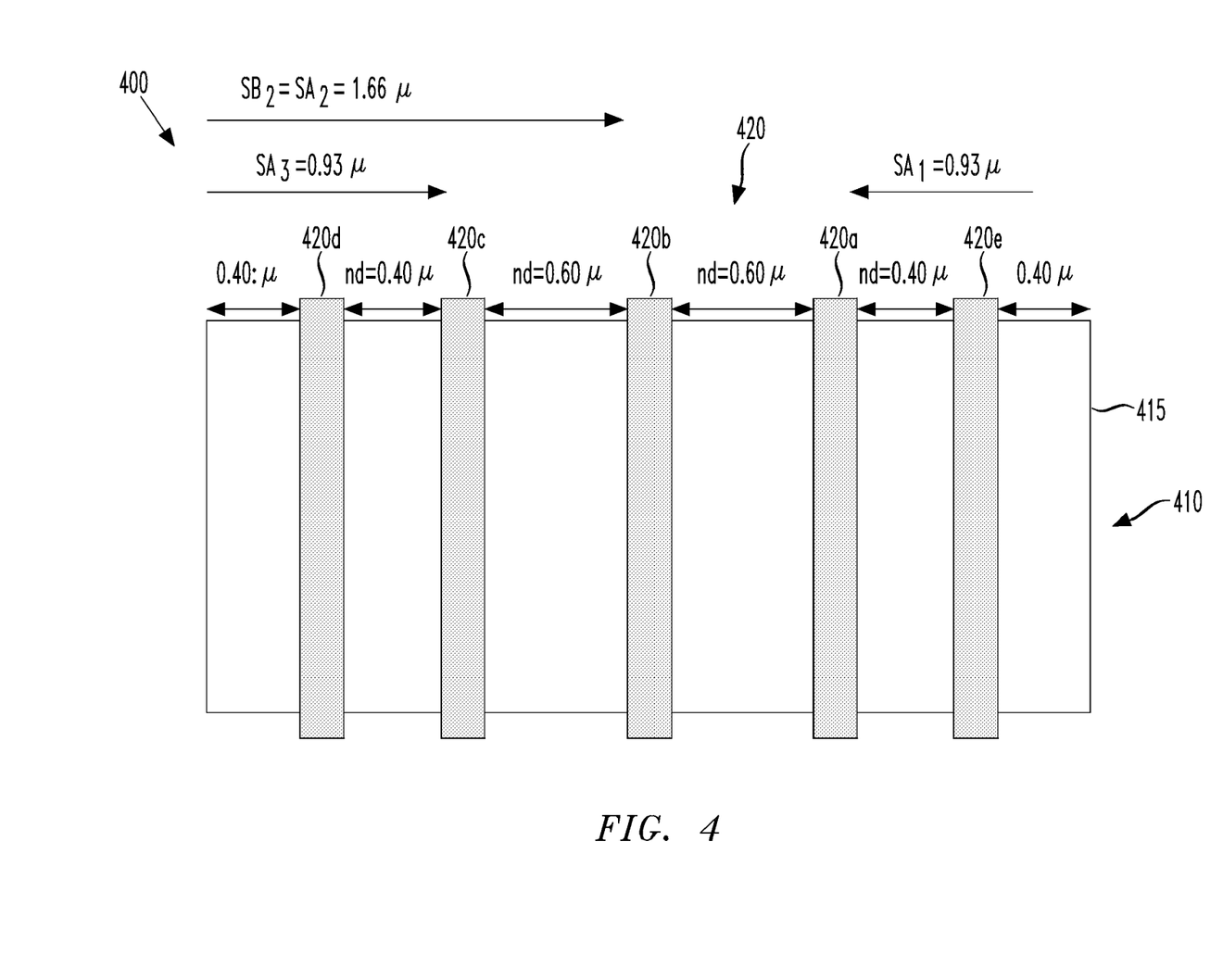
FIG. 4 is an overhead view of a layout model having modeled SA and nesting distances that can be compared to the SA data and nesting distance data to balance STI effect and optical proximity effect.

Turning now to FIG. 4, there is illustrated an overhead view of a design layout generated by a conventional design program of a MOSFET layout 400. The MOSFET layout 400, in this particular embodiment, includes a conventional isolation region 410, such as a STI structure, and a thin oxide region 415, such as a gate oxide. It should be noted that the MOSFET layout 400 may be either a layout of an NMOS or a PMOS device. In the illustrated embodiment, multiple gate structures 420 are located over the thin oxide region 415 as shown. For purposes of discussion, the gate structures 420 may include active gates 420a, 420b, and 420c and dummy gates 420d and 420e. It should be understood that the number and configuration of the active gates and the dummy gates may vary depending on design.

The requested type of MOSFET layout 400 having the appropriate SA distance and nesting distance, designated nd associated with the active gates 420a, 420b, and 420c is generated by a conventional layout design software program, as shown in FIG. 4. The SA distance is about the distance from the edge of the isolation region 410 to the most adjacent edge of each of the active gate structures 420a, 420b and 420c. For example, in FIG. 4, the SA distance for the active gate 420a is shown as the distance from the left edge of the isolation region 410 to the right edge of the active gate 420a and is designated $SA_1$. In an actual layout design, this distance was also about 0.93 microns. The SA distance for the active gate 420b is shown as the distance from the right edge of the isolation region 410 to the left edge of the active gate 420b and is designated, $SA_2$. In an actual layout design, this distance was about 1.66 microns, (in this case $SB_2=SA_2$ because the distance from the right side of 420b to the 410 boundary on the right is 1.66 which also equals $SA_2$. For any gate stripe, SA and SB can be defined from the gate to the nearest and farthest respective STI boundaries). The SA distance for the active gate 420c is shown as the distance from the right edge of the isolation region 410 to the left edge of the active gate 420c and is designated, $SA_3$. In an actual layout design, this distance was also about 0.93 microns.

The nesting distance between the active gate 420b and the adjacent active gates 420b and 420a in the actual layout design was about 0.60 microns, and the nesting distance between the active gates 420a and 420c and their respective dummy gates 420e and 420d in the actual layout design was about 0.40 microns. To obtain a more varied data population, SA and nesting distances can be obtained from a number of test structures having differing speeds or performance levels, if so desired.

Once the SA and nesting distances for the MOSFET layout 400 are known, they can be correlated to the STI and optical proximity data collected from the test devices as discussed above to see what the value of the electrical property would be when taking both STI effect and optical proximity effect into account. Thus, from the foregoing, the complementary STI and optical proximity effects can be correlated with different electrical properties of a transistor device, which can be used to obtain a closer match between the electrical properties of pre-production models and the actual product. For example, turning again to FIGS. 2A and 2B, attention will be focused on the average speed device, represented by line 210, for the STI effect and on the "middle" of the data spread in FIG. 2B for the optical proximity effect. From FIG. 4, $SA_1$, which is the SA distance for active gate structure 420a, is equal to 0.93 microns. When this SA distance is plotted to FIG. 2A, the estimated STI $I_{on}$ is about 6.1. From FIG. 4, the nesting distance of active gate structure 420a is equal to 0.40 microns. When this nesting distance is plotted to FIG. 2B, the estimated OPC $I_{on}$ is about 6.5. For simplicity and purposes of illustration only, an arithmetic mean, which generally equates to balancing the STI effect and the optical proximity effect, can be taken between these two values to obtain an $I_{on}$ value of about 6.3. It should be understood, of course, that those skilled in the art could develop mathematical algorithms implemented in software, as discussed below, to manipulate the data reflected in FIGS. 2A and 2B to obtain the optimum $I_{on}$ number that would most effectively balance the STI and optical proximity effects. Thus from this, a designer would, with a much higher degree of certainty than before, be able to predict that based on the gate spacing, width, and length, and SA distance configuration of the model, the actual production device, having the same configuration would yield an $I_{on}$ of about 6.3. The electrical designer could then use this information to adjust the electrical design model such that its $I_{on}$ would be 6.3. Alternatively, the silicon designer could adjust the SA distance and the nesting distance to target a desired $I_{on}$ to match a critical design value in the electrical model.

The same procedure as just described above for active gate structure 420a can also be conducted for active gate structure 420b. For example, turning again to FIGS. 2A and 2B, attention will be focused on the average speed device, represented by line 210, for STI effect and on the "middle" of the data spread in FIG. 2B for the optical proximity effect. From FIG. 4, $SA_2$, which is the SA distance for active gate structure 420b, is equal to 1.66 microns. When this SA distance is translated to FIG. 2A, the estimated STI $I_{on}$ is about 6.2. From FIG. 4, the nesting distance of active gate structure 420b is equal to about 0.60 microns. When this nesting distance is translated to FIG. 2B, the estimated $I_{on}$ is about 6.4. As before, for simplicity and purposes of illustration only, an arithmetic mean can be taken between these two values to obtain an $I_{on}$ value of about 6.3. Similar calculations can be made with respect to all of the active gate structures within the test device and similar analysis can also be conducted with respect to $V_T$ and $I_{off}$. This approach can be implemented regarding PMOS devices, using, of course, the graphs based on the data obtained from the PMOS test device. Again, a designer would be able to predict that based on the spacing, width, and length configuration of the model, the actual production device, having the same configuration would yield an $I_{on}$ of about 6.3.

As just mentioned, the STI and optical proximity effects can be correlated with different electrical properties of the transistor. For example, $V_T$, for the same NMOS and PMOS devices as just discussed above were also taken. In the NMOS device, the $V_T$ decreased as the SA distance increased, while in the PMOS device the $V_T$ slightly increased as the SA distance increase. $I_{off}$ was also correlated to SA distance for both the NMOS and PMOS devices. In the NMOS device, $I_{off}$ slightly increased as the SA distance increased, and in the PMOS device, $I_{off}$ slightly decreased as the SA distance increased. The nesting distance for the NMOS device was also correlated to both $V_T$ and $I_{off}$. $V_T$ increased as the nesting distance increased and the $I_{off}$ decreased as the nesting distance increased.

Figure 5:
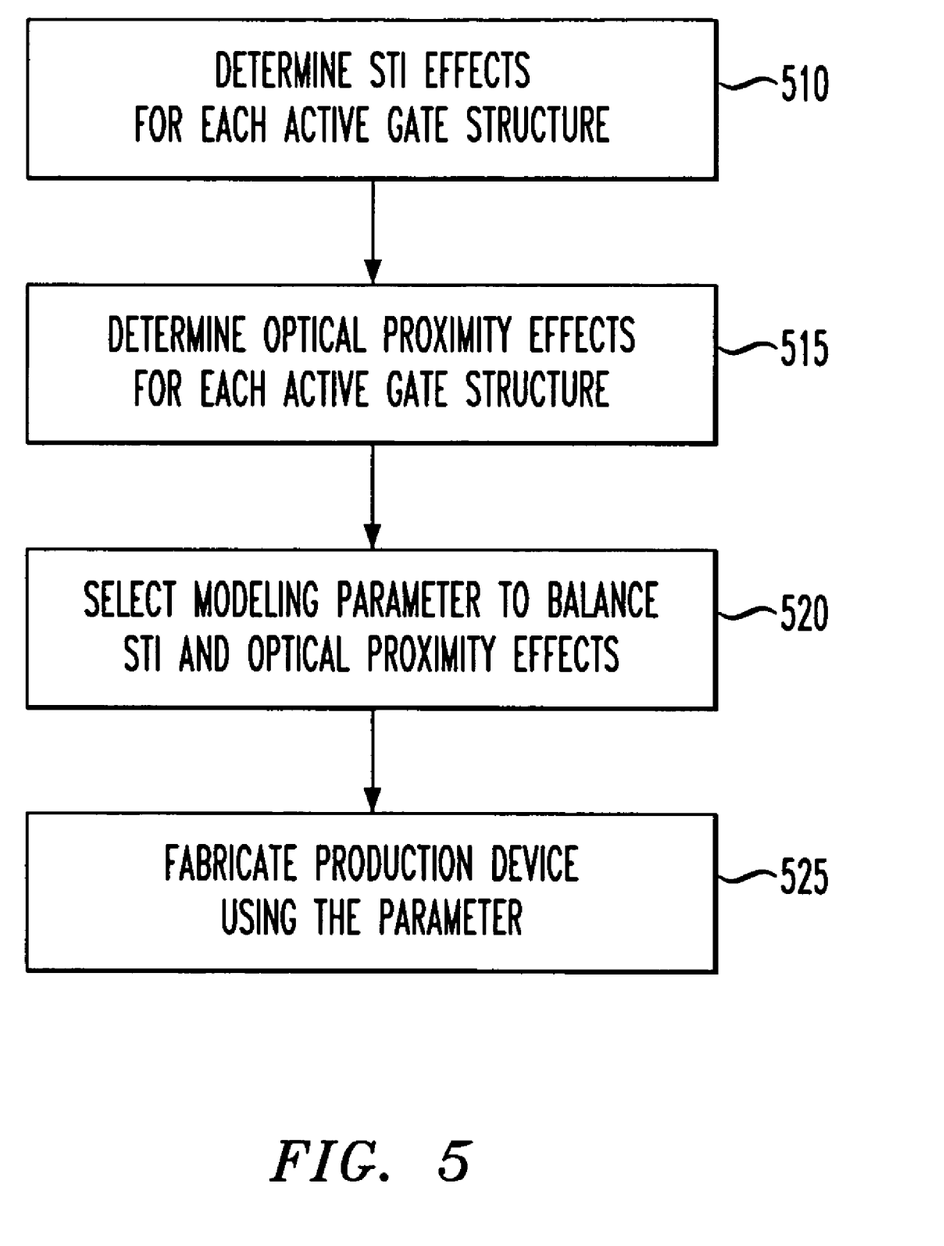
FIG. 5 is an illustration of a method flow to balance STI stress with optical proximity effect and sets forth certain steps of a more generalized embodiment as covered by the present invention.

Turning now to FIG. 5, there is an illustration of a method flow to balance STI stress with optical proximity effect and sets forth certain steps of a more generalized embodiment as covered by the present invention. In step 510, an isolation structure stress effect of a first semiconductor device is determined. The isolation structure stress effect can be determined by determining the SA as it relates to an electrical property of the first semiconductor device, as discussed in the example above. In step 515, an optical proximity effect of a second semiconductor device can be determined by determining the nesting distance as it is related to an electrical property of the second semiconductor device, as discussed in the example above. It should be noted that these two steps may be determined simultaneously or be determined in reverse order. It should also be noted that the first and second semiconductor devices may be the same device or different devices. Moreover, the device may include a plurality of active gate structures, as shown in FIG. 4. In such embodiments, the STI and optical proximity effects are determined with respect to each active gate structure.

In step 520, a modeling design parameter is selected such that the isolation structure stress effect is offset against the optical proximity effect. In an advantageous embodiment, the modeling design parameter may be imputed into simulation modeling software on a computer to verify that the STI effect and the optical proximity effect have been adequately offset in the computer model. The design parameter that is selected may vary depending on the embodiment. For example, in one embodiment, the modeling design parameter is SA distance, as discussed above, and in an advantageous embodiment, the SA distance is an optimum SA distance. In yet another embodiment, the modeling design parameter may be an on current ($I_{on}$), threshold voltage ($V_T$) or off current ($I_{off}$).

In yet another embodiment, the modeling design parameter includes selecting a nesting distance, as discussed above, and advantageously, the nesting distance is an optimum nesting distance. That is, it is a nesting distance that is representative of the OPC data pool. Preferably, the values of these design parameters can be chosen in such that they best fit device specifications or device performance requirements.

Once the design parameter is selected, whether it be SA distance, nesting distane, $I_{on}$, $V_T$, or $I_{off}$, it can then, in step 525, be used to ultimately construct a third semiconductor device, which typically will be the production device that includes an operative integrated circuit. The concepts provided by the present invention are very flexible. For instance, if a certain $I_{on}$ is desired, then STI and OPC can be chosen in such a way as to yield that particular $I_{on}$, based on the data discussed above. Similarly, if a certain $V_T$ or $I_{off}$ is desired, then STI and OPC can be chosen for these electrical properties as well in such a way as to yield the desired $V_T$ or $I_{off}$. Alternatively, if a certain spacing, width or length of the gate structures is required, then the electrical property can be set and correlated to the appropriate SA distance and nesting distance based on the data obtained in FIGS. 2A and 2B. In another application, if the corrected or adjusted $I_{on}$ is known in the model, then change to the electrical designs layout can be made to arrive at an actual device for that particular $I_{on}$.

Figure 6:
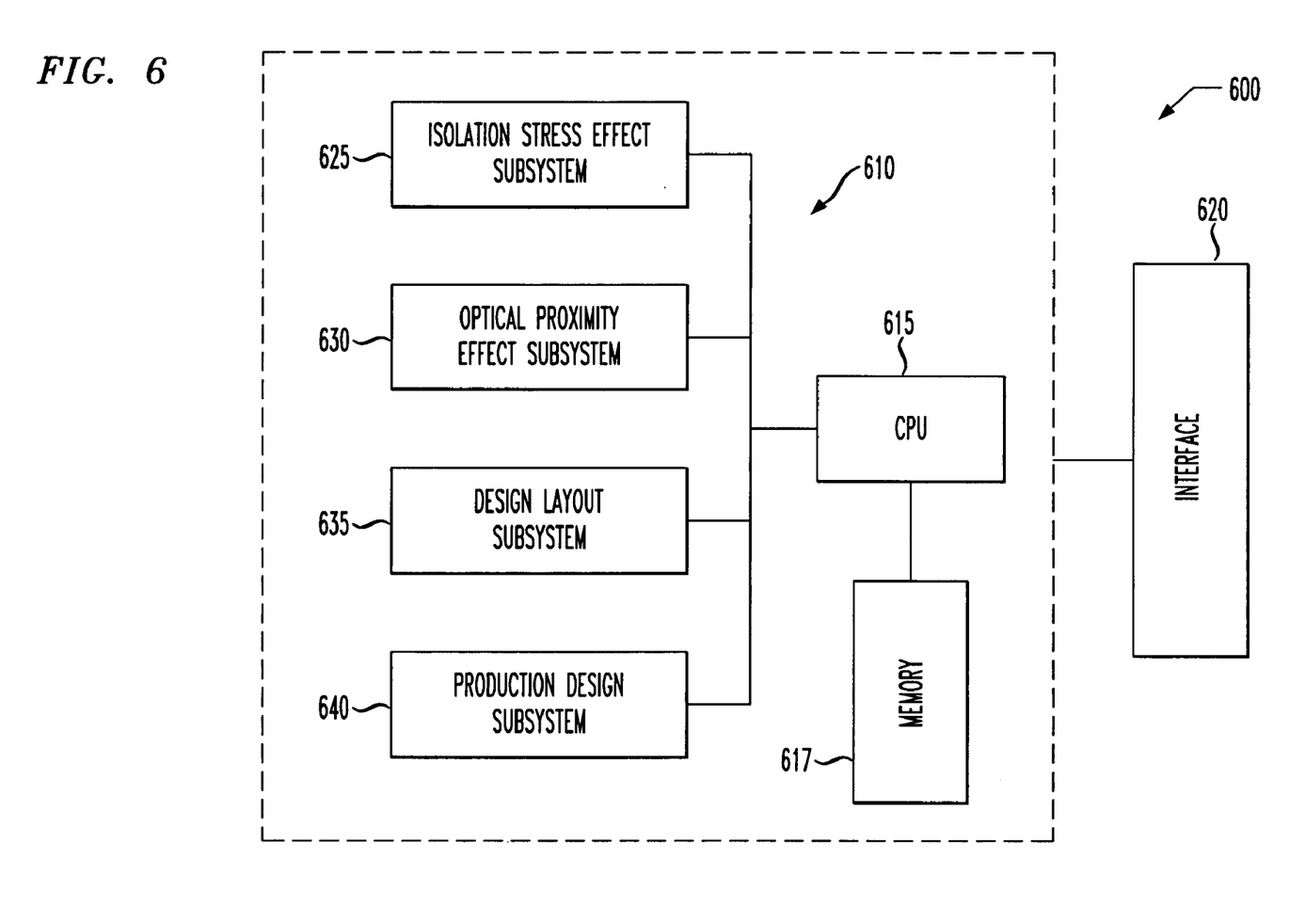
FIG. 6 is a schematic representation of a computer system on which software subsystems in accordance with the present invention can be implemented.

Turning now to FIG. 6, illustrated is a schematic representation of a computer system 600 on which software subsystems 610 in accordance with the present invention, can be implemented. In one embodiment, the computer system 600 comprises a conventional central processor (CPU) 615 having conventional memory 617 associated therewith, and a conventional CPU interface 620, such as a keyboard. The computer system 600 which includes an isolation structure stress effect subsystem 625 that contains stored data for providing isolation structure stress effect data of a first semiconductor device, as discussed above. Within the computer system 600 is also an optical proximity effect subsystem 630 for providing optical proximity effect data of a second semiconductor device, as discussed above. The computer system 600 further includes a design layout subsystem 635 that uses the isolation structure stress effect data and the optical proximity effect data to derive a model design layout such that the isolation structure stress effect is offset against the optical proximity effect, and the system also includes a production design subsystem 640 that uses the model design layout to model a production semiconductor device that includes an integrated circuit.

The data within these various subsystems are implemented with software contained within the memory 617 and controlled by the CPU 615. Those who are skilled in the art would understand how to develop such software to run on a conventional computer system. In one advantageous application, the designer would be given desired design specifications for a given transistor design layout. Using the computer system 600, the designer could enter a preferred model layout. For example, the designer could specify a design having 10 gate structures with a given spacing and of specified lengths and widths.

Using the software and the data in the subsystems discussed above, the computer system 600 would run the calculations necessary to effectively offset the isolation stress effects and the optical proximity effects and would graphically suggest a model having perhaps differing gate structures with a different spacing, widths and lengths than those originally designated. This is exemplary only and those skilled in the art can easily see that the principles provided by the present invention can be used in a number of ways to achieve the production device that is desired.

Thus, from the foregoing, it is readily seen that the present invention provides a method of insuring a more accurate prediction of the electrical properties between a modeled integrated circuit and the actual production device.

Although the present invention has been described in detail, those skilled in the art should understand that they can make various changes, substitutions and alterations herein without departing from the spirit and scope of the invention in its broadest form.

What is claimed is:

1. A method for manufacturing a semiconductor device, comprising:
    determining an isolation structure stress effect of a first semiconductor device, wherein the first semiconductor device includes an isolation structure and a gate and determining the isolation structure stress effect includes determining a correlation between an electrical property of the first semiconductor device and a SA distance between the gate edge and the isolation structure;
    determining an optical proximity effect of a second semiconductor device;
    modeling a semiconductor device that includes the isolation structure stress effect and the optical proximity effect; and
    selecting a modeling design parameter of the semiconductor device such that either one or both of the isolation structure stress effect or the optical proximity effect is changed.

2. The method as recited in claim 1 further including using the selected design parameter to construct a third semiconductor device.

3. The method of claim 1 wherein selecting a modeling design parameter includes selecting a SA distance.

4. The method of claim 1 wherein the electrical property is an on current ($I_{on}$), or threshold voltage ($V_t$), or off current ($I_{off}$) of the gate and selecting a modeling design parameter includes selecting one of said ($I_{on}$), ($V_t$), or ($I_{off}$).

5. The method as recited in claim 1 wherein the second semiconductor device includes a plurality of gate structures and determining the optical proximity effect includes determining a correlation between an electrical property of each of the gate structures and a nest distance between each of the gate structures.

6. The method as recited in claim 5 wherein selecting the modeling design parameter includes selecting a nesting distance.

7. The method as recited in claim 5 wherein the electrical property is an on current ($I_{on}$), threshold voltage ($V_t$), or off current ($I_{off}$) and selecting the modeling design parameter includes selecting at least one of said ($I_{on}$), ($V_t$), or ($I_{off}$).

8. The method as recited in claim 1 wherein the first and second semiconductor devices include a plurality of gate structures and determining the isolation structure stress effect and determining the optical proximity effect includes determining the isolation structure stress effects and the optical proximity effects associated with each of the gate structures.

9. The method as recited in claim 8 wherein a portion of the gate structures are active gate structures and a remaining portion are dummy gate structures.

10. The method as recited in claim 1 wherein the first semiconductor device and the second semiconductor device are the same semiconductor device.

11. The method as recited in claim 1 wherein the third semiconductor device is an integrated circuit including interconnected transistors.

12. A system for producing a semiconductor device model for use in fabricating an integrated circuit, comprising:
 an isolation structure stress effect subsystem for providing isolation structure stress effect data of a first semiconductor device, wherein the isolation structure stress effect data includes data of a correlation between an electrical property of a gate of the first semiconductor device and a SA distance between an edge of the gate and an isolation structure of the first semiconductor device;
 an optical proximity effect subsystem for providing optical proximity effect data of a second semiconductor device;
 a design layout subsystem that uses the isolation structure stress effect data and the optical proximity effect data to derive a model design layout such that either or both of the isolation structure stress effect or the optical proximity effect is changed; and
 a production design subsystem that uses the model design layout to model a production semiconductor device that includes an integrated circuit layout.

13. The system as recited in claim 12 wherein the first semiconductor device includes a plurality of gate structures and the physical property is an on current ($I_{on}$), threshold voltage ($V_t$), or off current ($I_{off}$), associated with each of the gate structures, and the data are a correlation between an on ($I_{on}$), ($V_T$), or ($I_{off}$) of each of the gates and a SA distance associated with each of said gates.

14. The system as recited in claim 13 wherein a portion of the gate structures are active gate structures and a remaining portion are dummy gate structures.

15. The system as recited in claim 12 wherein the optical proximity effect data includes data of a correlation between a physical property of a first gate structure of the second semiconductor device and a nesting distance between the first gate structure and a second, adjacent gate structure.

16. The system as recited in claim 15 wherein the second semiconductor device includes a plurality of gate structures and the electrical property is an on current ($I_{on}$), threshold voltage ($V_t$), or off current ($I_{off}$) associated with each of the gate structures, and the data are a correlation between an ($I_{on}$), ($V_T$), or ($I_{off}$) of each gate and a nesting distance between each of the gates.

17. The system as recited in claim 16 wherein a portion of the gate structures are active gate structures and a remaining portion are dummy gate structures.

18. The system as recited in claim 12 wherein the isolation structure stress effect subsystem, the optical proximity effect subsystem, the design layout subsystem, and the production design subsystem are embodied in software programs capable of being implemented on a computer.

19. The system as recited in claim 12 further including a computer by which the software programs can be implemented.

* * * * *